United States Patent
Tominaga

(10) Patent No.: US 7,110,088 B2
(45) Date of Patent: Sep. 19, 2006

(54) EXPOSURE APPARATUS AND DEVICE MANUFACTURING METHOD

(75) Inventor: Yasuteru Tominaga, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/998,736

(22) Filed: Nov. 30, 2004

(65) Prior Publication Data
US 2005/0117136 A1 Jun. 2, 2005

(30) Foreign Application Priority Data
Dec. 2, 2003 (JP) .............................. 2003-402900

(51) Int. Cl.
G03B 27/42 (2006.01)
G03B 27/52 (2006.01)
(52) U.S. Cl. .......................................... 355/53; 355/30
(58) Field of Classification Search ................. 355/30, 355/53, 55, 67; 250/548
See application file for complete search history.

(56) References Cited

U.S. PATENT DOCUMENTS 6,078,380 A 6/2000 Taniguchi et al. ............ 355/52
6,333,775 B1* 12/2001 Haney et al. ................. 355/30
6,633,364 B1* 10/2003 Hayashi ....................... 355/53
6,707,529 B1* 3/2004 Aoki et al. ................... 355/30
6,961,114 B1* 11/2005 Murayama et al. ........... 355/30

FOREIGN PATENT DOCUMENTS

JP  6-29179  2/1994

\* cited by examiner

Primary Examiner—Henry Hung Nguyen
(74) Attorney, Agent, or Firm—Fitzpatrick, Cella, Harper & Scinto

(57) ABSTRACT

An exposure apparatus for exposing a substrate to light from a light source via a reticle. The exposure apparatus includes an optical system configured to expose the substrate to light from the light source via the reticle, and has a first optical element, a motor configured to move the first optical element, a first housing accommodating at least the first optical element and the motor, a second housing accommodated in the first housing, accommodating at least a part of the motor, and configured to isolate the part of the motor from the first optical element, a first exhaust system configured to exhaust a first space between the first housing and the second housing, and a second exhaust system configured to exhaust a second space in the second housing.

12 Claims, 9 Drawing Sheets

EXPOSURE APPARATUS AND DEVICE MANUFACTURING METHOD

BACKGROUND OF THE INVENTION

1. Field of the Invention

The present invention relates generally to an exposure apparatus. In particular, the invention relates to an exposure apparatus used for exposing an object to be processed (substrate), such as a single crystal substrate for a semiconductor device or a glass substrate for a liquid crystal display (LCD). The present invention is suitable, for example, for an exposure apparatus using a light beam having a wavelength not longer than 200 nm.

2. Related Background Art

There is an increasing demand for miniaturization of a semiconductor element installed in an electronic device in order to respond to recent requests for reduction in size and thickness of the electronic device. Up to now, a projection exposure apparatus has been used in a lithography (printing) process for manufacturing a semiconductor element, the apparatus projecting and transferring a circuit pattern drawn on a reticle or mask (in this application, the two terms are interchangeably used) onto a wafer, etc., by using a projection optical system.

A resolution (minimum transferable size) R of a projection exposure apparatus is represented by the following expression using a wavelength $\lambda$ of a light source and a numerical aperture (NA) of a projection optical system:

$$R = k_1 \times \lambda / NA$$

where $k_1$ represents a process constant defined by a development process, etc.

Accordingly, the shorter the wavelength, the higher the resolution. Based on this, in recent years, an exposure light source has shifted from a conventional extra-high pressure mercury lamp (g line (wavelength: about 436 nm) or i line (wavelength: about 365 nm)) to a KrF excimer laser (wavelength: about 248 nm) or an ArF excimer laser (wavelength: about 193 nm) having a shorter wavelength than conventional ones. Further, an $F_2$ laser (wavelength: about 157 nm) is coming into practical use.

Also, there arises a need to improve a throughput (the number of wafers to be processed per unit time) in a projection exposure apparatus. Since an exposure time for each object to be processed needs to be shortened in order to improve the throughput, an illumination of exposure light, i.e., an exposure amount, in which each object to be processed is irradiated with light per unit time, needs to be increased.

However, an exposure light beam having a shorter wavelength (for example, a light beam having a wavelength in a vacuum ultraviolet region) is absorbed in a larger amount in oxygen or an impurity (water vapor, carbon dioxide, organic material, or halide; also referred to as a contaminant) existing in an atmosphere in an optical path of the exposure light (reduction in transmissivity), resulting in reduction in throughput as well as in exposure light amount of the object to be processed. In general, as the wavelength of the light beam shortens, photon energy gradually increases, causing a photochemical reaction between the contaminant and oxygen. If a product (ammonium sulfate or silicon dioxide) generated by the photochemical reaction adheres to an optical element, the surface of the optical element is fogged, leading to not only a further reduction in exposure light amount, but also, deterioration in imaging performance.

To that end, in a projection exposure apparatus employing a KrF excimer laser or an ArF excimer laser as a light source, optical elements arranged in an optical path are accommodated in a space purged with inert gas in order to avoid reduction in transmissivity due to the absorption of a light beam by oxygen, etc., in an atmosphere in an optical path, or reduction in an exposure light amount and deterioration in imaging performance due to adherence of the product generated by the photochemical reaction to the surface of the optical elements. Also, the purged space is made free of any substance having a gas-producing property, which prevents a contaminant from being generated (see Japanese Patent Application Laid-Open No. H06-029179, for example).

FIG. 9 is a schematic sectional view showing a main structural part of a conventional exposure apparatus 1000. Referring to FIG. 9, the exposure apparatus 1000 includes a lens unit 1200 provided inside a housing 1100, constituting an optical system. An exposure light EL from a light source 1400 is guided to the outside of the housing 1100 through seal glasses 1300a and 1300b. A pipe 1500a for supplying an inert gas and a pipe 1500b for exhausting the air in the housing are provided inside the housing 1100, for example. The inside of the housing 1100 is purged with the inert gas.

The exposure apparatus 1000 includes a rotating member 1700 having a plurality of filters 1600a and 1600b for adjusting a light amount of the exposure light EL, and a motor 1800 for driving the rotating member 1700, inside the housing 1100. The motor 1800 is disposed onto a motor holder 1820 fixed to the housing 1100 through a flange 1810. Note that a motor wiring 1830 is connected to a control unit or a power supply unit through an air-tight connector (not shown).

If the motor 1800 has a gas-producing property, an exhaust gas EG adheres to the lens unit 1200 due to a photochemical reaction, leading to deterioration in imaging performance, as well as a reduction in exposure light amount.

However, with a structure of the aforementioned conventional exposure apparatus, it becomes more difficult to sufficiently suppress a reduction in throughput and deterioration in imaging performance due to contamination of an optical element, as the wavelength of the exposure light becomes shortened. Although the motor is configured so as to minimize the exhaust gas production as mentioned above, it is impossible to use undesirable materials to maintain performance of the motor. For example, a solder or resin is used for a stator or a coil wire wound inside the stator, or other such internal members. Even if materials having a low gas-producing property are basically selected, however, an adhesive, grease, or the like, is used therefor, as well. As a result, as photon energy of the exposure light increases, a photochemical reaction is activated, so that an exhaust gas in a trace amount, which otherwise might cause no photochemical reaction, turns into a contaminant.

The exhaust gas discharged from the motor is known to contain moisture. In particular, a light beam of an $F_2$ laser is largely absorbed by moisture or oxygen. Hence, it is necessary to keep a water and an oxygen content in an optical path at an extremely low level. However, the structure of the conventional exposure apparatus requires a long time to reach such a water or an oxygen content so as to satisfy a required optical performance. This is supposedly because it takes much time to purge with an inert gas the air having intruded and accumulated in the inside of the motor or in minute gaps of a lens holding mechanism or other such mechanisms. Alternatively, this is supposedly triggered by moisture in an exhaust gas discharged from the motor. In addition, for example, if the optical element is fogged, an exposure apparatus needs to be open (canceling the purge with the inert gas) for replacing the optical element; at this time, moisture in the air may be mixed thereinto, so the apparatus should be stopped until the water or moisture content reaches such a level so as to satisfy the required exposure performance again, leading to a reduction in throughput.

SUMMARY OF THE INVENTION

It is, therefor, an exemplified object of the present invention to provide an exposure apparatus capable of suppressing adherence of a contaminant to an optical element surface, and realizing a high throughput and a satisfactory imaging performance.

According to one aspect of the invention, an exposure apparatus for transferring a pattern of an original onto a substrate by use of a light beam from a light source includes an optical system for guiding the light beam from the light source to the substrate through the original, a first housing accommodating at least a first element and a second element different from the first element of the optical system, a second housing accommodated in the first housing and accommodating at least a part of the second element, and a first purge system for purging a first space between the first housing and the second housing.

According to the present invention, it is possible to provide an exposure apparatus capable of suppressing adherence of a contaminant to an optical element surface, and realizing a high throughput and a satisfactory imaging performance.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such an example, however, is not exhaustive of the various embodiments of the invention, and, therefore, reference is made to the claims, which follow the description, for determining the scope of the invention.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE PREFERRED EMBODIMENTS

Hereinafter, an exposure apparatus according to an embodiment of the present invention will be described with reference to the accompanying drawings. Note that the same reference symbols are assigned to the same members throughout the drawings, and a repetitive explanation is omitted. Here, FIG. 1 is a schematic sectional view showing a structure of an exposure apparatus 1 according to the embodiment of the present invention.

Figure 1:
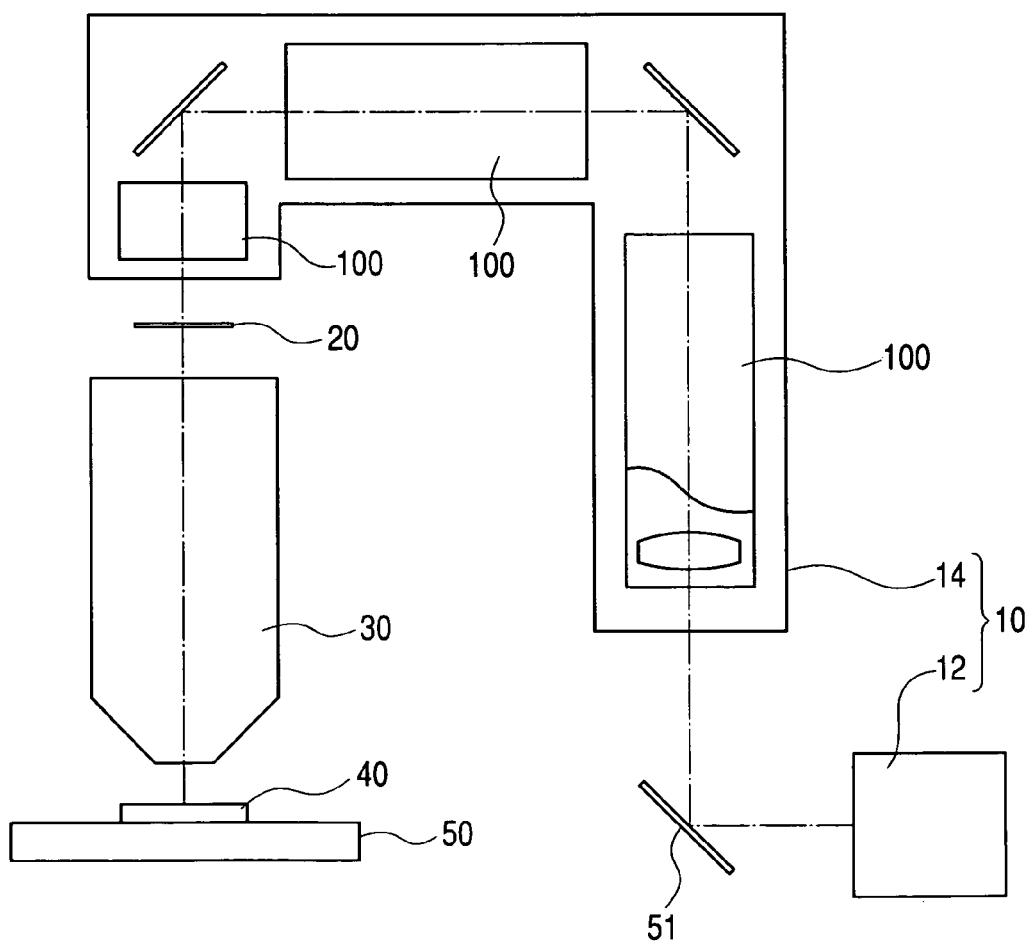
FIG. 1 is a schematic sectional view showing a structure of an exposure apparatus according to an embodiment of the present invention.

As shown in FIG. 1, the exposure apparatus 1 includes an illuminator 10 for illuminating a reticle 20 having a circuit pattern formed thereon; a projection optical system 30 for projecting a diffraction ray diffracted by the reticle pattern onto an object to be processed (plate) 40; and a stage 50 for supporting the object to be processed 40.

The exposure apparatus 1 serves as a projection exposure apparatus for projecting the circuit pattern formed on the reticle 20 to the plate 40 through exposure, by using a step-and-scan process or a step-and-repeat process, for example. Such an exposure apparatus is suitable for a lithography process requiring sub-micron processing or processing on or below the quarter-micron order. Herein below, in this embodiment, a description will be given taking as an example of an exposure apparatus employing the step-and-scan process (also called a "scanner"). Here, the "step-and-scan process" refers to an exposure method including sequentially scanning a wafer relative to the reticle to project the reticle pattern to the wafer through exposure, and moving the wafer, which has undergone exposure corresponding to one shot, stepwise, up to the next exposure region. The "step-and-repeat process" means an exposure method including moving a wafer stepwise for each collective exposure, up to an exposure region for the next shot.

The illuminator 10 includes an illumination optical system 14 and a light source portion 12 for illuminating the reticle 20 having a transfer circuit pattern formed thereon.

The light source portion 12 can employ an ArF excimer laser having a wavelength of about 193 nm, a KrF excimer laser having a wavelength of 248 nm, or the like, as a light source. However, the kind of light source is not limited to the excimer laser, but an $F_2$ laser having a wavelength of about 153 nm or a YAG laser may be used, for instance. Besides, the number of light sources is not limited. For example, if two solid lasers operating independently of each other are used, the solid lasers cause no coherence therebetween and considerably reduce speckles caused by the coherence. An optical system may be oscillated linearly or pivotally for further reduction in speckle. When the laser is used for the light source portion 12, it is preferable to use a beam shaping optical system for shaping a parallel beam emitted from the laser light source into a desired beam shape and an incoherence optical system for making a coherent laser beam incoherent. A light source applicable to the light source portion 12 is not limited to the laser, but one or more lamps, such as mercury lamps or xenon lamps, can be used.

The illumination optical system 14 is an optical system for illuminating the reticle 20, which includes a lens, a mirror, an optical integrator, and an aperture stop. This is, for example, an optical system where a condenser lens, a fly-eye lens, an aperture stop, another condenser lens, a slit, and an imaging optical system are arrayed in the stated order.

Figure 2:
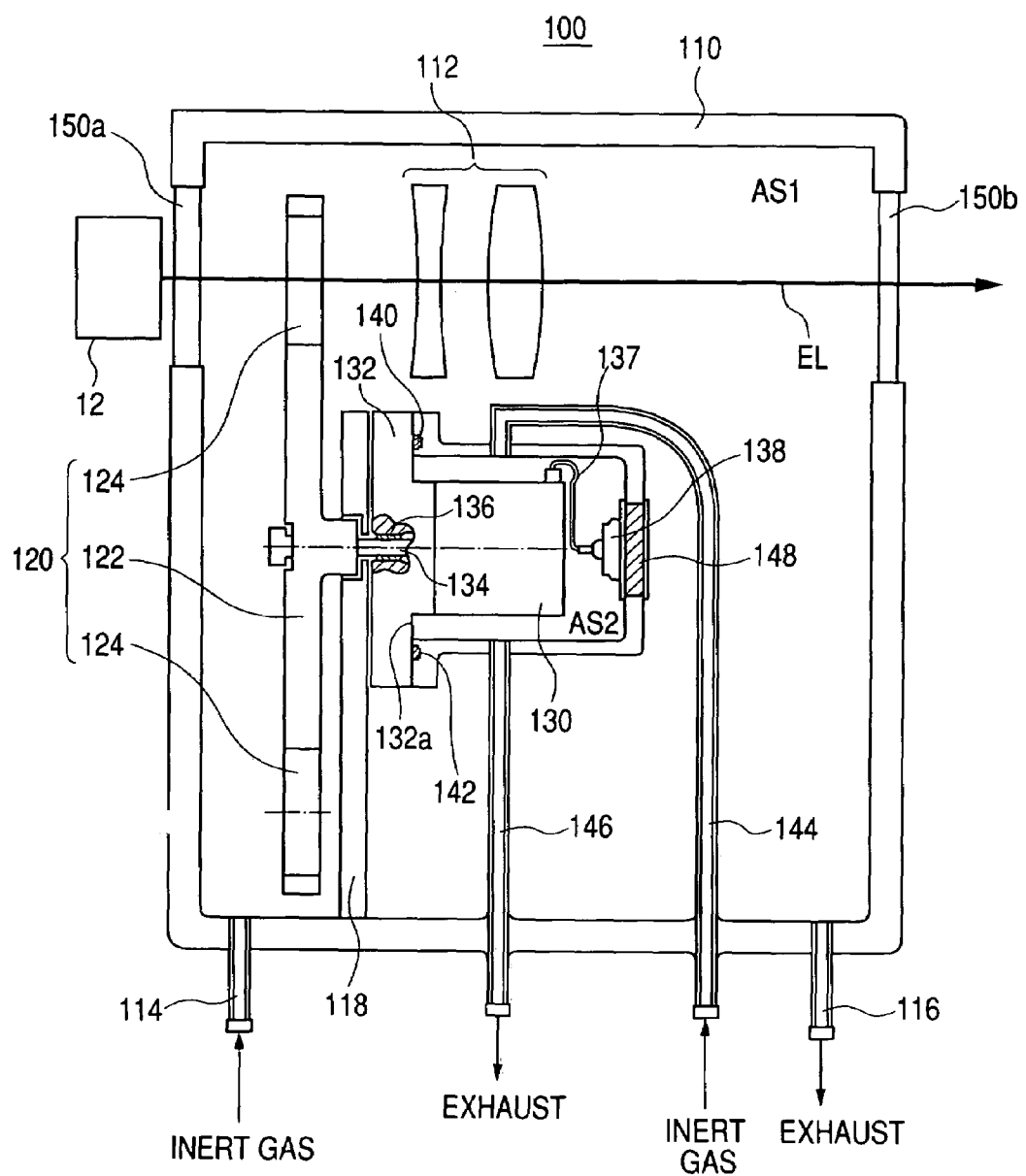
FIG. 2 is a schematic sectional view showing an example of a structure of an illumination system unit shown in FIG. 1.

The illumination optical system 14 is composed of a plurality of illumination system units 100 having lenses, etc., arranged therein. FIG. 2 is a schematic sectional view showing an example of a structure of the illumination system unit 100 shown in FIG. 1. The illumination system unit 100 includes a first housing 110 that defines a first space AS1 kept in a first atmosphere, and a second housing 140 that is isolated from the first atmosphere and also accommodated in the first housing 110 to define a second space AS2 kept in a second atmosphere, and has a double structure. The illumination system unit 100 guides an exposure light EL from the light source portion 12 through seal glasses 150a and 150b provided in the first housing 110.

Referring to FIG. 2, the illumination system unit 100 has a lens unit 112 and an optical member 120 inside the first space AS1 defined by the first housing 110. The first space AS1 is purged with an inert gas by means of a pipe 114 for supplying the inert gas and a pipe 116 for exhausting, which are provided to the first housing 110, and is kept at the first atmosphere.

The optical member 120 is arranged inside the first space AS1 purged with the inert gas and driven by a motor 130 accommodated inside the second housing 104, as described later. The optical member 120 is composed of, in this embodiment, a turret 122 and filters 124. Mounted on the turret 122 serving as a rotating member are the filters 124 of plural kinds different in degree of controlling the exposure light EL. The motor 130 is used to drive the turret 122 so as to switch between the plural filters 124.

The motor 130 is accommodated in the second housing 140 and isolated from the first space AS1. The motor 13 is held to a flange 132 and attached to a motor holder 118 in the first housing 110 through the flange 132. Also, the flange 132 has a partition 132a that defines the second spaces AS2 together with the second housing 140.

The flange 132 has a sealing member 136 formed of a material having a low gas-producing property, such as Teflon® or fluoroubber for the purpose of avoiding discharge of an exhaust gas from an internal member of the motor 130 having a gas-producing property, through a drive shaft 134 of the motor 130. In other words, the sealing member 136 is disposed between the flange 132 and the drive shaft 134 of the motor 130 to bring the flange 132 and the drive shaft 134 into close contact with each other. The member having a gas-producing property includes, for example, a plating member for a stator, etc., an insulating member for a coil, etc., grease used in a bearing, etc., and an adhesive or solder, etc., used for connecting wirings.

In the second housing 140, provided between the flange 132 (its partition 132a) and the second housing 140, is a sealing member 142 composed of an O-ring formed of a material having a low gas-producing property, such as fluororubber, with a view to avoiding diffusion into the first space AS1 of the exhaust gas from the stator of the motor 130 or exhaust gas from the motor 130, which leaks from a gap thereof. This provision enables isolation of the second space AS2 defined by the flange 132 and the second housing 140.

A motor wiring 137 and motor connector 138 are connected to a device (e.g., a power supply) outside the exposure apparatus 1 by means of wiring (not shown) through an air-tight connector 148 provided to the second housing 140. Also, the second housing 140 has a pipe 144 for supplying the inert gas and a pipe 146 for exhausting, the second space AS2 can be purged with the inert gas and be kept at the second atmosphere, aside from the first space AS1.

The second gas AS2 is thereby supplied with a clean, inert gas and the air is exhausted therefrom all the time, preventing the exhaust gas from the motor 130 from leaking to the first space AS1. Therefore, the illumination system unit 100 can prevent a photochemical reaction between the exposure light EL and the exhaust gas from the motor 130, prevent any contaminant from adhering to an optical element (i.e., the lens unit 112 or filter 124) surface, realize a high throughput, and exert a satisfactory imaging performance.

Besides, a cooling effect also can be obtained, making it possible to keep heat generated by the motor 130 from being transferred to its surrounding optical element (i.e., a lens unit 112). Note that a pressure of the second space AS2 is set to be lower than that of the first space AS1 (set to a negative pressure relative to that of the first space), whereby the exhaust gas from the motor 130 is prevented from leaking from the second space AS2 to the first space AS1, even if the sealing member 142 deteriorates.

In this way, the illumination system unit 100 can block out a current of the exhaust gas from the motor 130 and is applicable to the exposure apparatus 1 irrespective of the gas-producing property of a member constituting the motor 130. Further, even if the exposure apparatus is open for maintenance, etc., it is possible to prevent the air from intruding in a minute space of the motor 130, which can shorten a time from a halt to a restart-up of the apparatus.

Figure 3:
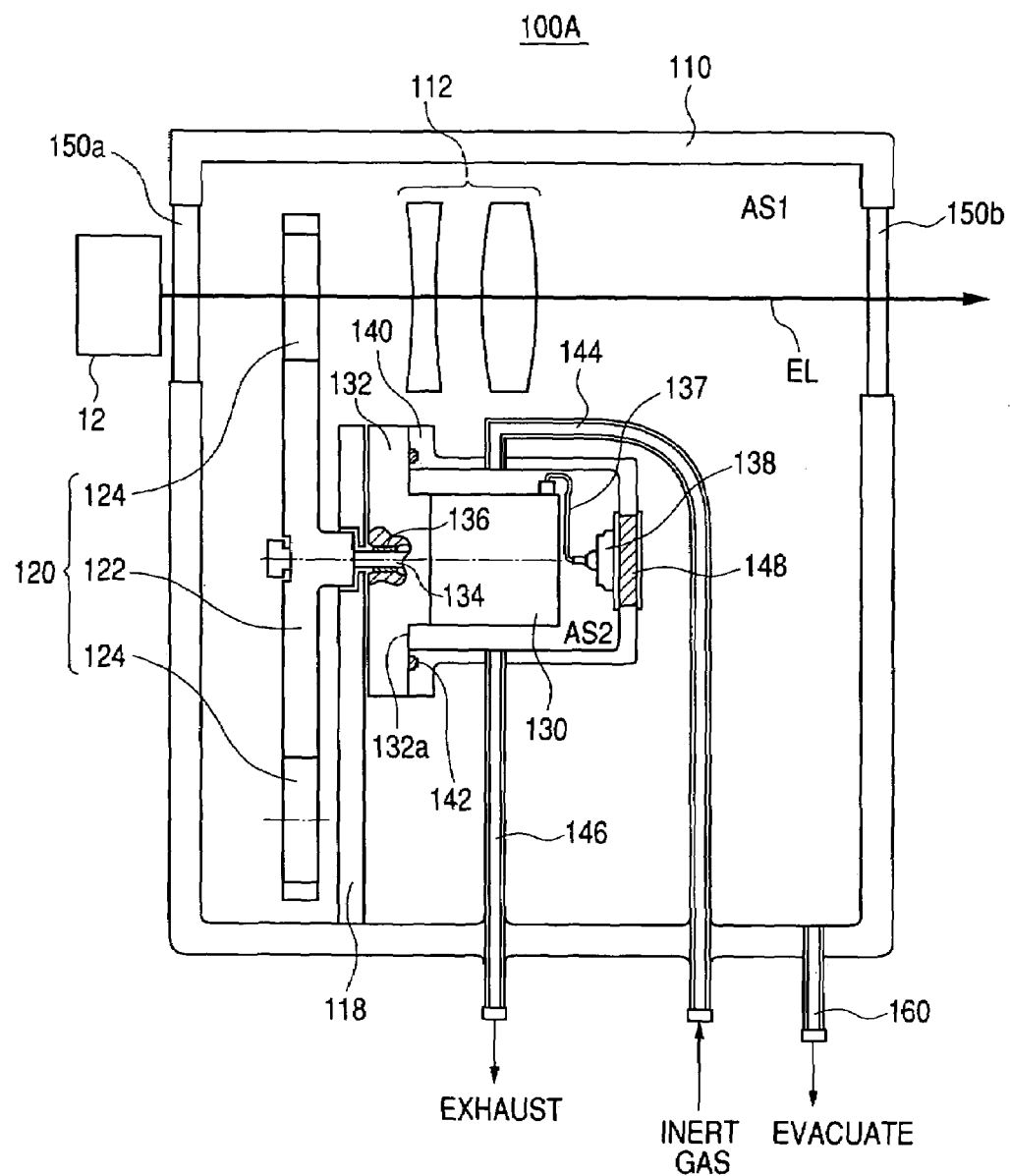
FIG. 3 is a schematic sectional view showing a structure of an illumination system unit as a modified example of the illumination system unit shown in FIG. 2.

Referring next to FIG. 3, an illumination system unit 100A as a modified example of the illumination system unit 100 shown in FIG. 2 will be explained. FIG. 3 is a schematic sectional view showing a structure of the illumination system unit 100A as the modified example of the illumination system unit 100 shown in FIG. 2. The illumination system unit 100A is similar to the illumination system unit 100, but is different therefrom in terms of the first atmosphere of the first space AS1 defined by the first housing 110.

Referring to FIG. 3, the illumination system unit 100A has a lens unit 112 and an optical member 120 inside the first space AS1 defined by the first housing 110. The first space AS1 is maintained at a predetermined degree of a vacuum by means of an evacuating pipe 160, which is provided to the first housing 100.

In the illumination system unit 10A, as with the illumination system unit 100, the motor 130 is arranged inside the second space AS2 isolated from the first space AS1, and defined by the flange 132 and the second housing 140, thereby preventing the exhaust gas from the motor 130 from leaking to the first space AS1.

Even if the exhaust gas from the motor 130 leaks from the second space AS2 where the motor 130 is disposed, the inert gas is supplied to the second space AS2 through the pipe 144 and gas including the exhaust gas from the motor 130 is exhausted from the second space through the pipe 146. An adverse influence of the exhaust gas can be suppressed.

The illumination system unit 100A can block out the current of the exhaust gas from the motor 130 even if the first space AS1 is evacuated to a predetermined degree of vacuum, and is also applicable to the exposure apparatus 1 irrespective of its gas-producing property of a member constituting the motor 130. Accordingly, the illumination system unit 100A can prevent a photochemical reaction between the exposure light EL and the exhaust gas from the motor 130, prevent any contaminant from adhering to optical elements (i.e., the lens unit 112 or filter 124) surface, realize a high throughput, and exert a satisfactory imaging performance.

Figure 4:
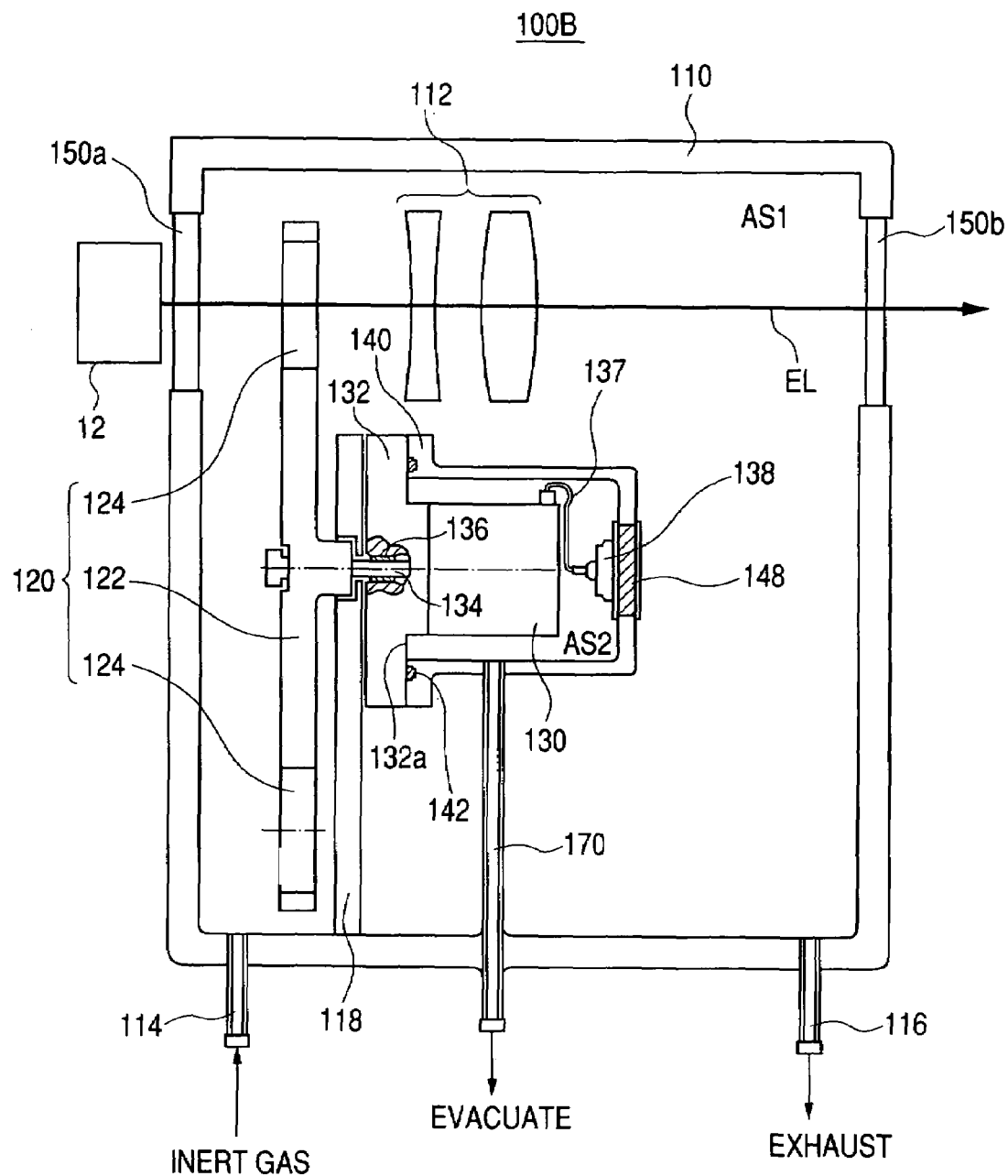
FIG. 4 is a schematic sectional view showing a structure of an illumination system unit as a modified example of the illumination system unit shown in FIG. 2.

Referring next to FIG. 4, an illumination system unit 100B as another modified example of the illumination system unit 100 shown in FIG. 2 will be explained. FIG. 4 is a schematic sectional view showing a structure of the illumination system unit 100B as the modified example of the illumination system unit 100 shown in FIG. 2. The illumination system unit 100B is similar to the illumination unit 100, but is different therefrom in terms of the second atmosphere of the second space AS2 defined by the second housing 140.

In the illumination system unit 100B, as with the illumination system unit 100, the motor 130 is disposed inside the second space AS2 isolated from the first space AS1, and defined by the flange 132 and the second housing 140. The second housing 140 has an evacuating pipe 170 and the second space AS2 can be evacuated and kept at a predetermined degree of vacuum, aside from the first space AS1. Thus, the exhaust gas from the motor 130 neither fills the second space AS2 nor leaks to the first space AS1 from the second space AS2.

The illumination system unit 100B evacuates the second space AS2 to a predetermined degree of vacuum, making it possible to block out a current of the exhaust gas from the motor 130. In addition, the pressure of the second space AS2 becomes lower than that of the first space AS1, whereby the exhaust gas form the motor 130 is kept from leaking from the second space AS2 to the first space AS1 even if the sealing member 142 deteriorates.

Therefore, the illumination system unit 100B can prevent a photochemical reaction between the exposure light EL and the exhaust gas from the motor 130, prevent any contaminant from adhering to an optical element (i.e., the lens unit 112 or filter 124) surface, realize a high throughput, and exert a satisfactory imaging performance.

Figure 5:
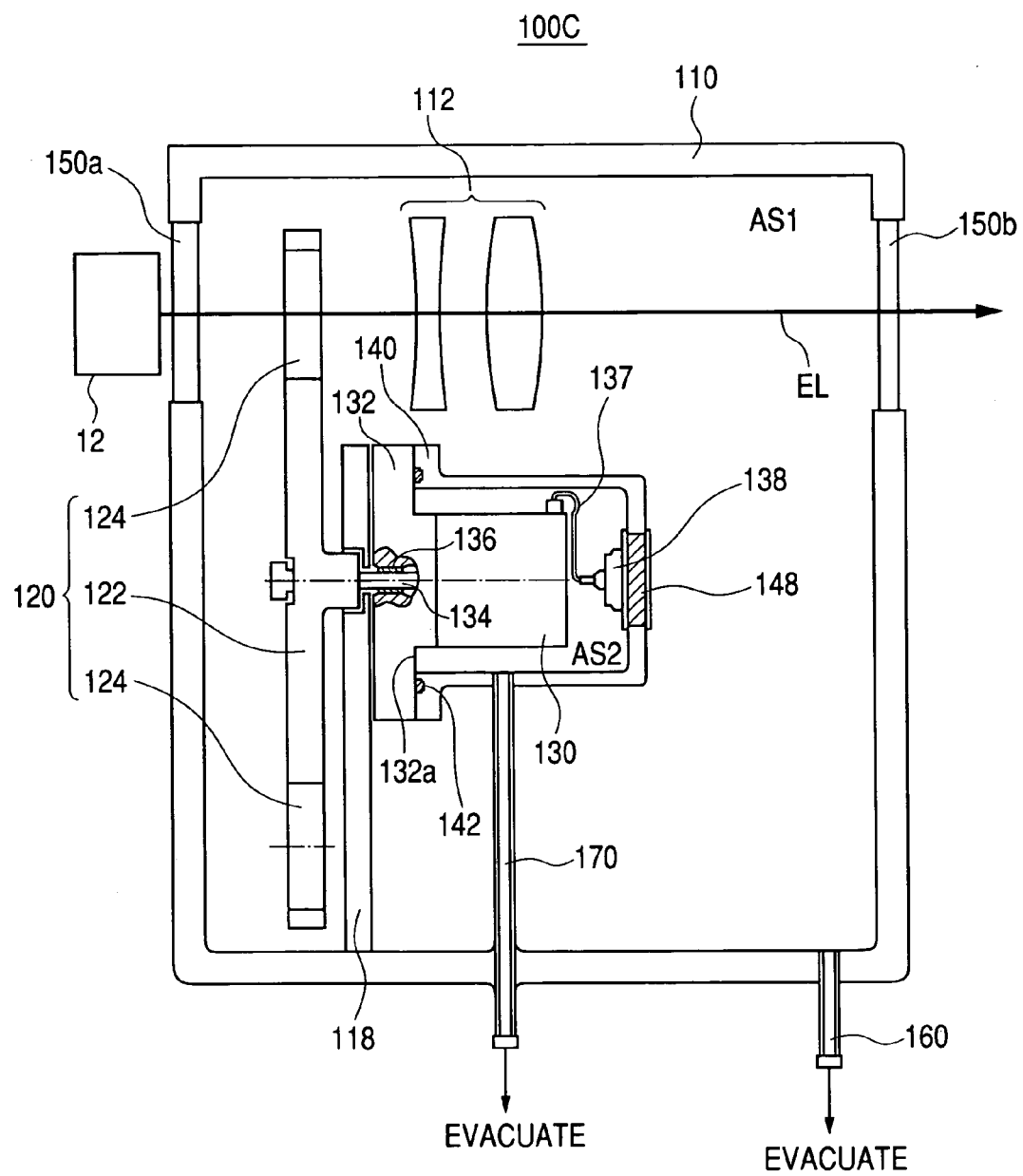
FIG. 5 is a schematic sectional view showing a structure of an illumination system unit as a modified example of the illumination system unit shown in FIG. 2.

Referring next to FIG. 5, an illumination system unit 100C as still another modified example of the illumination system unit 100 shown in FIG. 2 will be explained. FIG. 5 is a schematic sectional view showing a structure of the illumination system unit 100C as the modified example of the illumination system unit 100 shown in FIG. 2. The illumination system unit 100C is similar to the illumination system unit 100, but is different therefrom in terms of the first atmosphere of the first space AS1 and second atmosphere of the second space AS2 defined by the first housing 110 and the second housing 140, respectively.

Referring to FIG. 5, the illumination system unit 100C has the lens unit 112 and optical member 120 inside the first space AS1 defined by the first housing 110. The first space AS1 is maintained at a predetermined degree of vacuum by means of the evacuating pipe 160, which are provided to the first housing 110.

In the illumination system unit 100C, as with the illumination system 100, the motor 130 is disposed inside the second space AS2 isolated from the first space AS1, and defined by the flange 132 and the second housing 140. The second housing 140 has the evacuating pipe 170, and the second space AS2 can be evacuated and kept at a predetermined degree of vacuum, aside from the first space AS1.

Thus, the exhaust gas from the motor 130 neither fills the second space AS2 nor leaks to the first space AS1 from the second space AS2. Note that the pressure of the second space AS2 is set to be equal to or lower than that of the first space AS1, making it possible to prevent the exhaust gas from leaking without applying a large load to the sealing members 136 and 142. Further, the negative pressure aids in preventing the exhaust gas from the motor 130 from leaking from the second space AS2 to the first space AS1 even if the sealing member 142 deteriorates.

Accordingly, the illumination system unit 100C can prevent a photochemical reaction between the exposure light EL and the exhaust gas from the motor 130, prevent any contaminant from adhering to an optical element (i.e., the lens unit 112 or filter 124) surface, realize a high throughput, and exert a satisfactory imaging performance.

Figure 6:
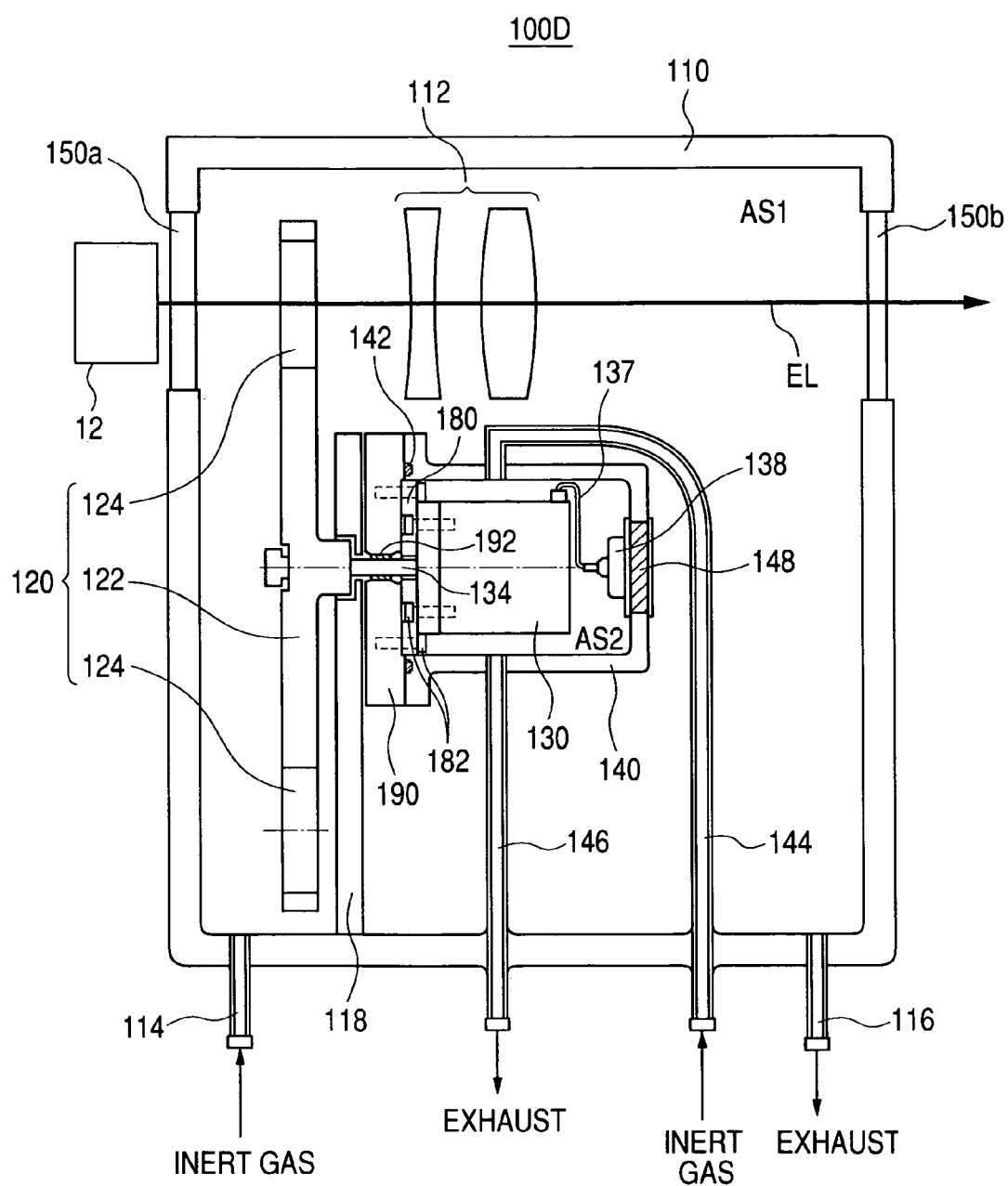
FIG. 6 is a schematic sectional view showing a structure of an illumination system unit as a modified example of the illumination system unit shown in FIG. 2.

Referring next to FIG. 6, an illumination system unit 100D, as still another modified example of the illumination system unit 100 shown in FIG. 2, will be described. FIG. 6 is a schematic sectional view showing a structure of the illumination system unit 100D as the modified example of the illumination system unit 100 shown in FIG. 2. The illumination system unit 100D is similar to the illumination system unit 100, but is different therefrom in terms of the structure of the flange 190.

Referring to FIG. 6, the motor 130 has an ordinary shape and is fixed to the flange 190 through a fixing member 180. Bolts 182 are used to connect the motor 130 and the fixing member 180, and the fixing member 180 and the flange 190. Note that a sealing member 192 is provided to the flange 190 for keeping air-tightness between the flange 190 and the drive shaft 134 of the motor 130. Hence, a structure sealing the drive shaft 134 can be obtained only by using the bolts 182 for connection among the motor 130, the fixing member 180, and the flange 190.

The second housing 140 is attached to the flange 190 so as to accommodate the motor 130 and the fixing member 180, through the sealing member 142, such as an O-ring. The motor wiring 137 and a motor connector 138 are connected to a device (e.g., a power supply) outside the exposure apparatus 1 by means of wiring (not shown) through the air-tight connector 148 provided to the second housing 140.

Similar to the illumination system unit 100, the second housing 140 has the pipe 144 for supplying the inert gas, and the pipe 146 for exhausting. Thus, the second space AS2 can be purged with the inert gas aside from the first space AS1. The second space AS2 is thereby supplied with a clean, inert gas and the air is exhausted therefrom all the time, preventing the exhaust gas form the motor 130 from leaking to the first space AS1.

In this way, the illumination system unit 100D can block out a current of the exhaust gas from the motor 130 and is also applicable to the exposure apparatus 1 irrespective of the shape of the motor 130 and the gas-producing property of a member constituting the motor 130. In other words, the illumination system unit 100D can prevent a photochemical reaction between the exposure light EL and the exhaust gas from the motor 130, prevent any contaminant from adhering to an optical element (i.e., the lens unit 112 or filter 124) surface, realize a high throughput, and exert a satisfactory imaging performance. Note that, in the illumination system unit 100D, although both the first space AS1 and the second space AS2 are purged with the inert gas, the same effect can be obtained even if the first space AS1 (or second space AS2) is purged with the inert gas and the second space AS2 (or first space AS1) is evacuated to a predetermined degree of vacuum, or both the first space AS1 and the second space AS2 are evacuated to a predetermined degree of vacuum.

As described above, with the illumination system units 100, 100A, 100B, 100C, and 100D, it is possible to prevent a reduction in throughput and deterioration in imaging performance caused by the adherence of the exhaust gas from a member having a gas-producing property, which constitutes the motor, to a lens, a mirror, or the like. In particular, in the case of using a laser having a short wavelength, such as an $F_2$ laser, which is absorbed by the moisture or oxygen, the reduction in the transmissivity of the exposure beam due to the absorption of the exposure beam by the air or moisture existent coming out from the motor can be suppressed by a simple configuration. Also, even if the exposure apparatus 1 is open for maintenance, etc., the air can be kept from intruding in a minute space in the motor.

Referring back to FIG. 1, the reticle 20 is made of, for example, quartz, a circuit pattern (or image) to be transferred is formed thereon, and the reticle is supported and driven by a reticle stage (not shown). The diffraction ray from the reticle 20 is projected onto the object to be processed 40 through the projection optical system 30. The reticle 20 and object to be processed 40 are optically conjugated with each other. The exposure apparatus 1 of this embodiment is a scanner and, thus, scans the object to be processed 40 and the reticle 20 at a scanning rate ratio corresponding to a reduction ratio, whereby the pattern on the reticle 20 is transferred onto the object to be processed 40. Note that with an exposure apparatus employing a step-and-repeat process (also called a "stepper"), exposure is carried out in a state wherein the reticle 20 and the object to be processed 40 stand still.

The projection optical system 30 projects a circuit pattern formed on the reticle 20, in a reduced form, to the object to be processed 40. As the projection optical system 30, an optical system composed exclusively of plural lens elements, an optical system composed of a plurality of lens elements and at least one concave mirror (catadioptric optical system), an optical system composed of a plurality of lens elements and at least one diffractive optical element, such as a kinoform, and an optical system composed entire of mirrors, can be used. If chromatic aberration needs to be corrected, a plurality of lens elements made of glass materials different from each other in dispersion value (Abbe number) may be used; alternatively, the diffractive optical element is configured so as to involve dispersion opposite to that of the lens element. A projection system unit is applicable to the projection optical system 30, as well, similar to the illumination system 100, the projection system unit including the first housing that defines the first space kept at the first atmosphere and the second housing 140 that is isolated from the first atmosphere and accommodated inside the first housing to define the second space kept at the second atmosphere, and having a double structure. This makes it possible to prevent a photochemical reaction between the exposure light and the contaminant existent in the projection optical system 30, keep the contaminant from adhering to the optical element surface, realize a high throughput, and exert a satisfactory imaging performance.

The object to be processed 40 is a wafer in this embodiment, but includes a wide variety of objects to be processed, for example, a liquid crystal substrate. The object to be processed 40 is applied with a photoresist. A photoresist application step includes a preprocess (upstream step), an adhesion improver applying process, a photoresist applying process, and a prebaking process. The preprocess includes cleaning, drying, and the like. The adhesion improver applying process is a surface modifying process for enhancing adhesion of a photoresist to a base (e.g., a hydrophobilizing process through a surfactant application), wherein the surface is coated with an organic film of hexamethyl-disilazane (HMDS), or the like, or subjected to a steaming. The prebaking process is a baking process, but is softer than a baking process following the development and directed to remove a solvent.

The stage 50 supports the object to be processed 40. Any structure known in the art is applicable to the stage 50, so an explanation of its detailed structure and operation is omitted here. For example, the stage 50 can move the object to be processed 40 in XY directions by use of a linear motor. The reticle 20 and the object to be processed 40 are scanned in synchronism with each other, for example. A laser interferometer is used, for example, to monitor the positions of the stage 50 and reticle stage (not shown), both of which are driven at a constant speed ratio. The stage 50 is placed on a stage surface table supported onto a floor, etc., for example, through the damper.

A light beam emitted from the light source portion 12 serves to subject the reticle 20 to Koehler illumination upon exposure by means of the illumination optical system 14, for example. The light beam that is reflective of the reticle pattern after passing through the reticle 20 is reduced at a predetermined magnification (e.g., ¼ or ⅕) by the projection optical system 30 and focused on the object to be processed 40.

The exposure apparatus 1 can prevent a contaminant due to the exhaust gas from the motor, from adhering to the optical element surface by use of the illumination system units 100, 100A, 100B, 100C, and 100D, or projection system unit (not shown), whereby a device (e.g., a semiconductor device, an LCD device, an image pickup device (a CCD, etc.), a thin film magnetic head, etc.) can be offered with high resolution and throughput, and low cost.

Figure 7:
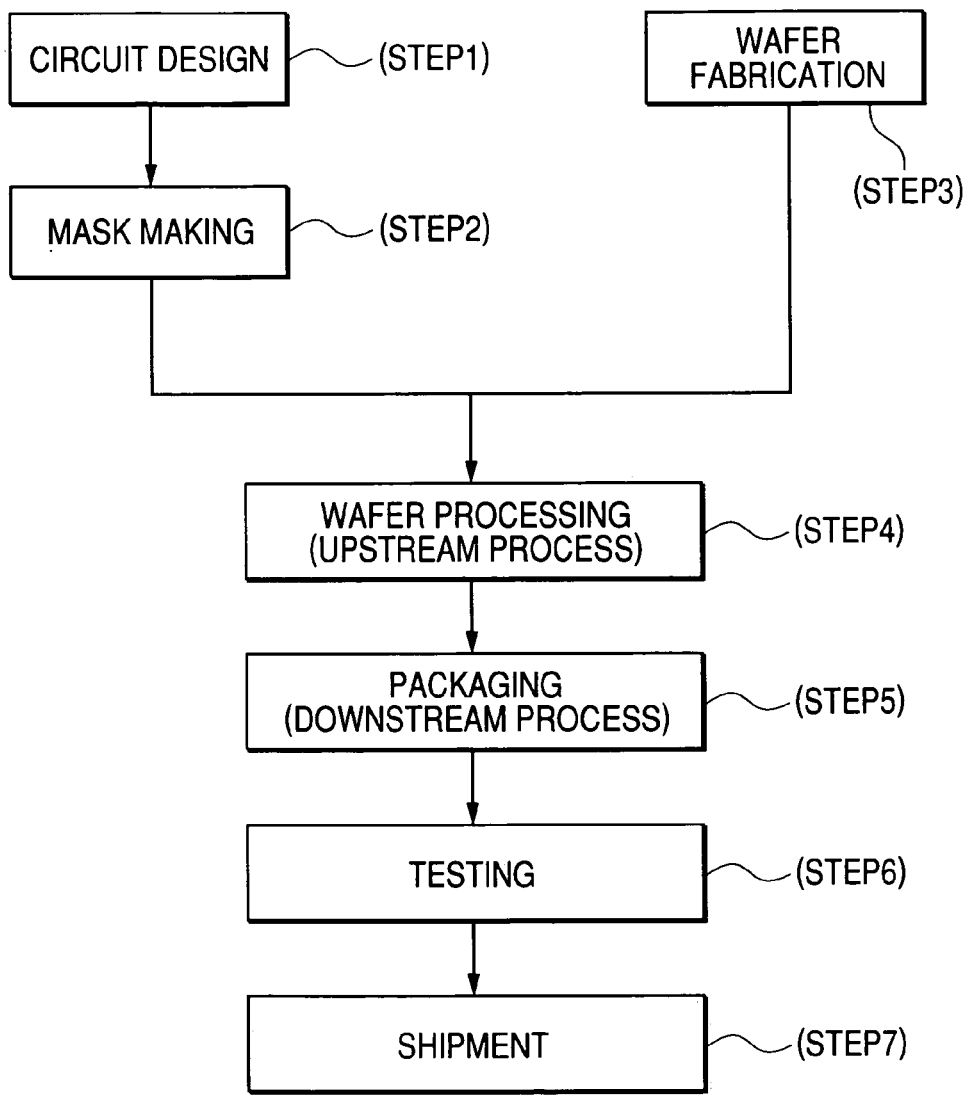
FIG. 7 is a flowchart illustrative of how to manufacture a device (e.g., a semiconductor chip, such as an IC or LSI, an LCD, a CCD, or the like)

Herein below, referring to FIGS. 7 and 8, an embodiment of a device manufacturing method using the aforementioned exposure apparatus 1 will be described. FIG. 7 is a flowchart illustrative of how to manufacture a device (e.g., a semiconductor chip, such as an IC or LSI, an LCD, a CCD, etc.). Here, a description is given taking the manufacture of the semiconductor chip as an example. In step 1 (circuit design), a circuit design of the device is carried out. In step 2 (mask making), a mask having a designed circuit pattern formed thereon is made. In step 3 (wafer fabrication), a wafer is fabricated using silicon or other such materials. Step 4 (wafer processing) is referred to as an upstream process, in which a mask and a wafer are used to form an actual circuit on the wafer by means of a lithography technique of the present invention. Step 5 (packaging) is referred to as a downstream process, in which the wafer fabricated in step 4 is turned into a semiconductor chip and which includes an assembly step (dicing and bonding), a packaging step (chip encapsulation), or other such steps. In step 6 (testing), the semiconductor device manufactured in step 5 is subjected to tests for operation and durability, for example. The semiconductor device is manufactured through those steps, followed by shipment (step 7).

Figure 8:
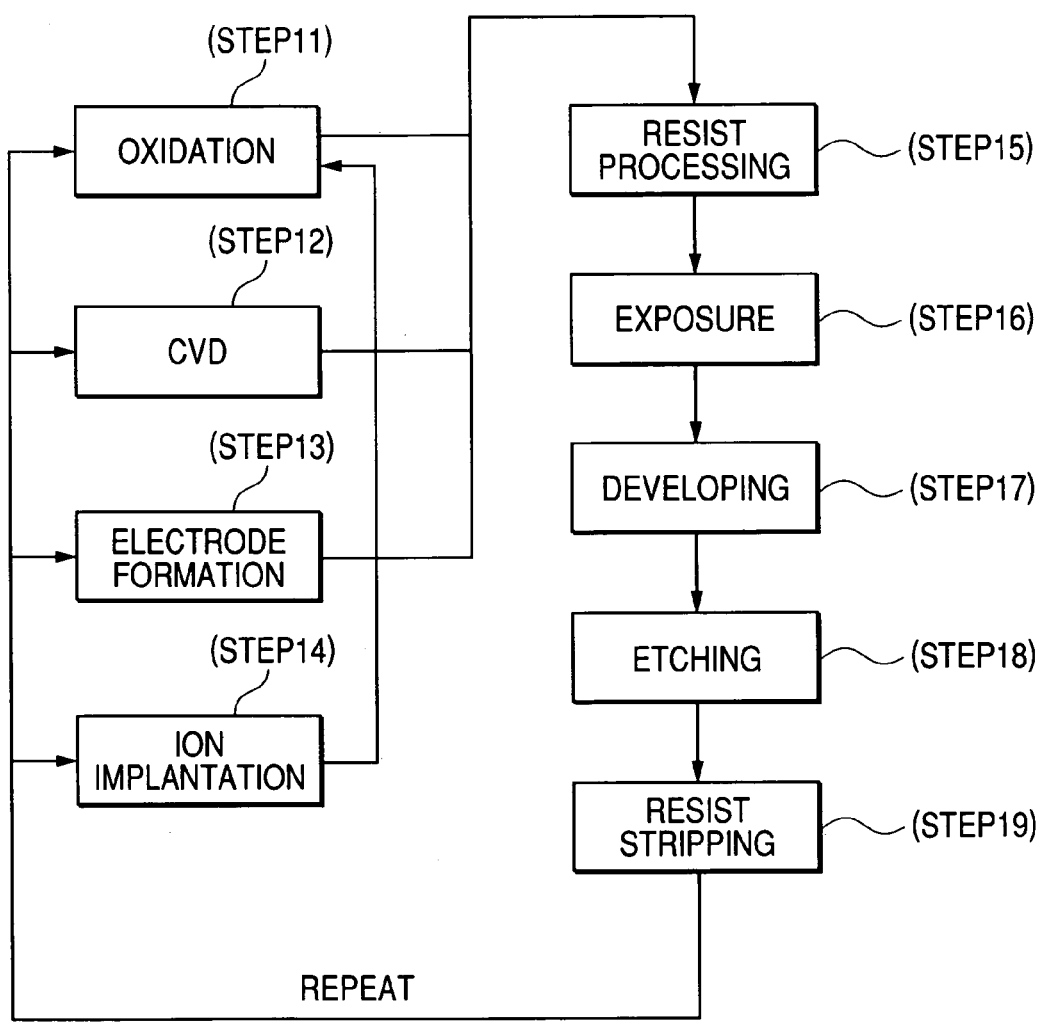
FIG. 8 is a flow chart of a detailed process flow of wafer processing in step S4 shown in FIG. 7.
Figure 9:
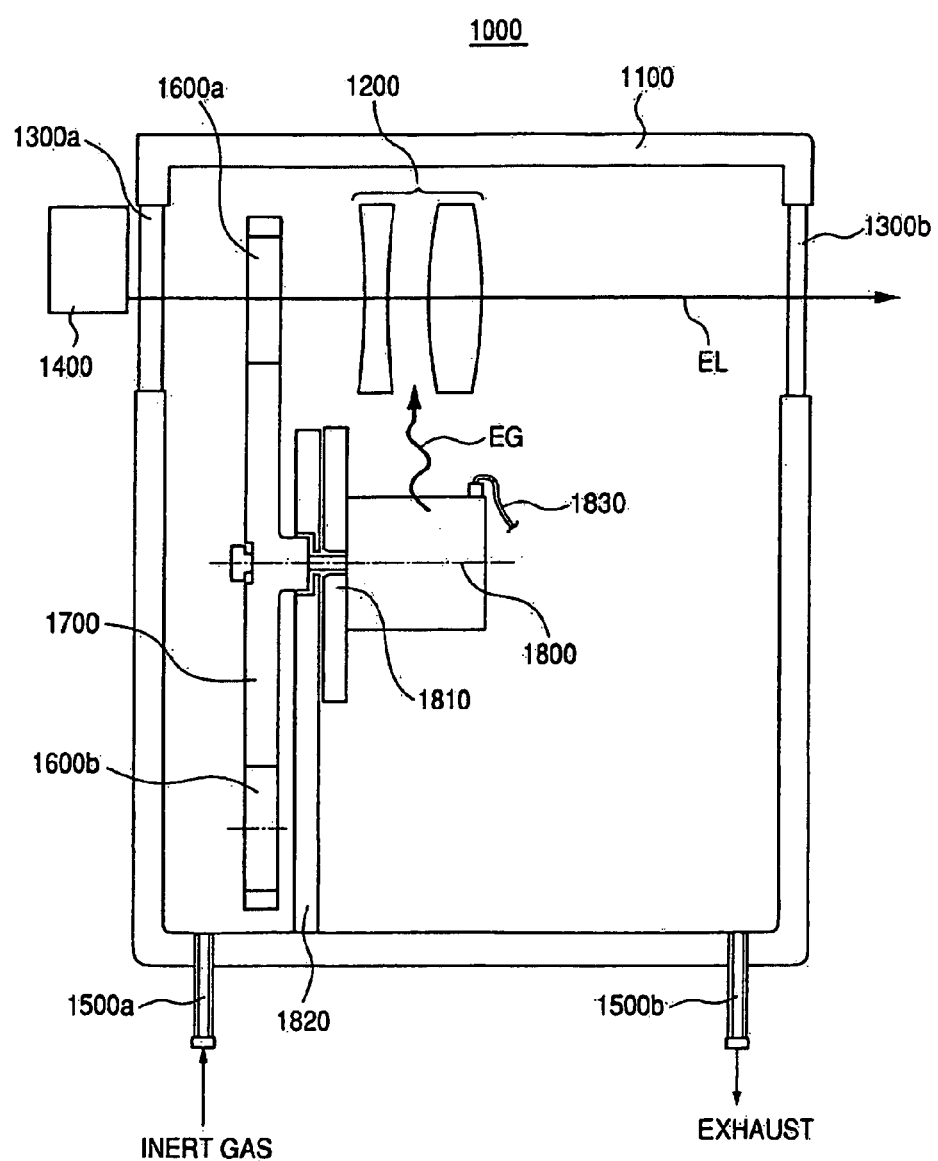
FIG. 9 is a schematic sectional view showing a main structural part of a conventional exposure apparatus.

FIG. 8 is a flowchart of a detailed process flow of the wafer processing in step 4. In step 11 (oxidation), the wafer surface is oxidized. In step 12 (CVD), an insulating film is formed on the wafer surface. In step 13 (electrode formation), an electrode is formed on the wafer through evaporation, etc. In step 14 (ion implantation), ions are implanted into the wafer. In step 15 (resist processing), a photoresist is applied onto the wafer. In step 16 (exposure), the circuit pattern of the mask is projected to the wafer through exposure by use of the exposure apparatus 1. In step 17 (developing), the exposed wafer is developed. In step 18 (etching), a portion other than the developed resist image is etched off. In step 19 (resist stripping), an unnecessary resist after the etching is stripped off. Repeating those steps forms multiple circuit patterns on the wafer. The device manufacturing method according to the present invention makes it possible to manufacture the device with a quality higher than conventional ones. As set forth above, the device manufacturing method using the lithography technique of the present invention, and its resulting device are regarded as an embodiment of the present invention.

The preferred embodiment of the present invention has been described so far. However, the present invention is not limited thereto, but allows various modifications and changes without departing from the spirit of the invention. For example, the present invention is applicable to an EUV exposure apparatus using an EUV light beam as a light source. Also, the member accommodated in the second housing is not limited to the motor, but may be members discharging contaminants.

The present invention is not limited to the above embodiments and various changes and modifications can be made within the spirit and scope of the present invention. Therefore, to apprise the public of the scope of the present invention, the following claims are made.

This application claims priority from Japanese Patent Application No. 2003-402900 filed on Dec. 2, 2003, which is hereby incorporated by reference herein.

What is claimed is:

1. An exposure apparatus for exposing a substrate to light from a light source via a reticle, said exposure apparatus comprising:
    an optical system configured to expose the substrate to light from the light source via the reticle, and having a first optical element;
    a motor configured to move the first optical element;
    a first housing accommodating at least said first optical element and said motor;
    a second housing accommodated in said first housing, accommodating at least a part of said motor, and configured to isolate the part of the motor from said first optical element;
    a first exhaust system configured to exhaust a first space between said first housing and said second housing; and
    a second exhaust system configured to exhaust a second space in the second housing.

2. An apparatus according to claim 1, wherein said second housing comprises a flange configured to hold said motor.

3. An apparatus according to claim 2, wherein said flange includes an opening, which a drive shaft of said motor penetrates, and a sealing member configured to seal the opening.

4. An apparatus according to claim 1, wherein said first and second exhaust systems are configured so that pressure in the second space is lower than pressure in the first space.

5. An apparatus according to claim 1, wherein said second housing includes an opening, which a drive shaft of said motor penetrates, and a sealing member configured to seal the opening.

6. An apparatus according to claim 5, wherein said sealing member comprises fluoroplastic.

7. An apparatus according to claim 1, wherein said first optical element comprises a turret including a plurality of filters, and said motor is configured to rotate said turret.

8. An apparatus according to claim 1, wherein said second housing comprises a connector configured to wire said motor.

9. An apparatus according to claim 1, wherein the light includes one of ultraviolet light, far ultraviolet light, vacuum ultraviolet light, and extreme ultraviolet light.

10. A method of manufacturing a device, said method comprising steps of:
    transferring a pattern of an original to a substrate using an exposure apparatus as defined in claim 1;
    developing the substrate to which the pattern has been transferred; and
    processing the developed substrate in order to manufacture the device.

11. An apparatus according to claim 1, further comprising a first supply system configured to supply inert gas to the first space.

12. An apparatus according to claim 1, further comprising a second supply system configured to supply inert gas to the second space.

* * * * *